US012704571B2

(12) United States Patent
Bindseil et al.

(10) Patent No.: US 12,704,571 B2
(45) Date of Patent: Aug. 11, 2026

(54) VARIABLE THERMAL CONDUCTANCE LINK FOR SUPERCONDUCTING PERSISTENT CURRENT SWITCH FOR FAST MAGNET RAMPING

(71) Applicant: Synaptive Medical, Inc., Toronto (CA)

(72) Inventors: Geron André Bindseil, London (CA); William Bradfield Handler, London (CA); Chad Tyler Harris, Toronto (CA)

(73) Assignee: SYNAPTIVE MEDICAL INCL

( * ) Notice: Subject to any disclaimer, the term of this patent is extended or adjusted under 35 U.S.C. 154(b) by 189 days.

(21) Appl. No.: 18/622,177

(22) Filed: Mar. 29, 2024

(65) Prior Publication Data

US 2025/0306146 A1 Oct. 2, 2025

(51) Int. Cl.

*G01R 33/38* (2006.01)
*G01R 33/3815* (2006.01)
*H01F 6/04* (2006.01)

(52) U.S. Cl.

CPC ..... *G01R 33/3815* (2013.01); *G01R 33/3804* (2013.01); *H01F 6/04* (2013.01)

(58) Field of Classification Search

CPC .... G01R 33/3815; G01R 33/3804; H01F 6/04
See application file for complete search history.

(56) References Cited

U.S. PATENT DOCUMENTS 5,661,401 A 8/1997 Ishikawa et al.
6,067,001 A 5/2000 Xu et al.
6,157,280 A 12/2000 Arz et al.
(Continued)

FOREIGN PATENT DOCUMENTS

CN 101297211 A 10/2008
CN 104730475 B 7/2020
(Continued)

OTHER PUBLICATIONS

Harris et al.: “A New Approach to Shimming: The Dynamically Controlled Adaptive Current Network”, Magnetic Resonance in Medicine, vol. 71, No. 2, pp. 859-869, published on Mar. 15, 2013 (Mar. 15, 2013).

*Primary Examiner* — G.M. A Hyder

(57) ABSTRACT

A system and method for rapid ramping of an MRI magnet. The system includes a cooling source for the magnet, a persistent current switch and a variable thermal link connecting the persistent current switch and cooling source. The thermal link provides a low thermal conductance connection from the cooling source to the persistent current switch while the magnet is ramping and a high thermal conductance connection for rapid cooling of the persistent current switch when the magnet reaches a target current corresponding to a target magnetic field. The method includes connecting a thermal link to a persistent current switch and a cooling source of the magnet, providing a low thermal conductance connection through the thermal link from the cooling source to the persistent current switch while the MRI magnet is ramping and a high thermal conductance connection when the MRI magnet has reached a target current corresponding to a target magnetic field, thereby providing a rapid cooling of the persistent current switch.

19 Claims, 6 Drawing Sheets

(56) References Cited

U.S. PATENT DOCUMENTS

| | | | | |
|---|---|---|---|---|
| 6,278,275 | B1 | 8/2001 | Petropoulos et al. | |
| 6,977,502 | B1 | 12/2005 | Hertz | |
| 7,598,740 | B2 | 10/2009 | Fischer et al. | |
| 8,319,495 | B1 | 11/2012 | Zhu | |
| 8,390,288 | B2 | 3/2013 | Graesslin et al. | |
| 8,720,072 | B2 | 5/2014 | Bucco | |
| 11,320,500 | B2 | 5/2022 | Authelet et al. | |
| 11,385,308 | B2 | 7/2022 | Popescu | |
| 2019/0108933 | A1 | 4/2019 | Urbahn et al. | |
| 2020/0279680 | A1* | 9/2020 | Mine | G01R 33/3804 |
| 2022/0172917 | A1* | 6/2022 | Van Lanen | H01H 50/12 |

FOREIGN PATENT DOCUMENTS

| | | | |
|---|---|---|---|
| CN | 111707690 | B | 10/2022 |
| CN | 117100244 | A | 11/2023 |
| DE | 4422781 | C1 | 2/1996 |
| DE | 10025582 | C1 | 12/2001 |
| JP | 3083475 | B2 | 9/2000 |
| JP | 6062234 | B2 | 1/2017 |
| JP | 7458316 | B2 | 3/2024 |
| WO | 2004046745 | A1 | 6/2004 |

* cited by examiner 61b
60b
60a
61a
63

61b
60b
60a
61a
64

60a
65a
60b
61a
61b 65b
61a
61b
67

VARIABLE THERMAL CONDUCTANCE LINK FOR SUPERCONDUCTING PERSISTENT CURRENT SWITCH FOR FAST MAGNET RAMPING

TECHNICAL FIELD

The field of the invention is systems and methods for magnetic resonance imaging ("MRI"), and more specifically systems and methods of providing cooling for persistent current switches for superconducting MRI magnets.

BACKGROUND

One key component of a magnetic resonance imaging ("MRI") device is a superconducting switch known generally as a persistent current switch. Typically, the persistent current switch needs to be kept warm and above its superconducting transition temperature during ramping of the magnetic field of the magnet and be made cold as soon as possible after ramping. If the persistent current switch reaches a higher temperature during ramping, it will take a longer time to cool down following the completion of magnet ramping. For this reason, a persistent current switch is designed such that throughout the ramping process, the persistent current switch temperature remains at a moderately higher temperature above its superconducting transition temperature. The temperature a persistent current switch reaches during the ramping process is influenced by its geometry and physical properties, how it is being cooled, the heat that is being deposited through heaters, if any, and the control of the output of the power supply that is connected to the magnet and the persistent current switch.

The total time to complete ramping the magnet can be reduced by adjusting the thermal connection to the persistent current switch to be in a low (or weak) thermal conductance state during the ramp and a high (or strong) thermal conductance state after the magnet is ramped. High thermal conductance is needed only briefly during persistent current switch cooldown, whereas it is desirable to have a lower thermal conductance while the persistent current switch is open during the ramping process. While the system is at field in persistent mode there is no preference to have the persistent current switch thermal connection be high or low thermal conductance.

Cooldown time after ramping could also be potentially improved by designing the persistent current switch thermal connection to be perpetually in a high thermal conductance state; however, this would need to be accompanied with a correspondingly high switch heat power dissipation during ramping to ensure the temperature of the persistent current switch remains above the superconducting transition temperature. Most MRI systems have a large bath of liquid helium filling the magnet vessel and the helium is in contact with the persistent current switch. During ramping, the persistent current switch is heated and the switch boils helium off, but this is recondensed by the cold head. Contact with helium can quickly cool the persistent current switch. In dry superconducting systems, such as cryogen-free MRI magnets with contact cooling only, the persistent current switch is only cooled through thermal contact with thermally conducting material. For such dry magnets, the heat power that can be extracted is limited by practical considerations, especially the cooling capacity of the cryogenic cold head in contact with the persistent current switch. Thus, rapid cooldown of the persistent current switch is a special problem for dry superconducting magnets where the persistent current switch is not in contact with liquid helium.

The capability of rapidly cooling down a persistent current switch after ramping is only important for systems designed to ramp quickly to persistent mode, such as magnets used for an interventional MRI ("iMRI") where the field should be turned on quickly and ready for imaging in a short time. For example, a system designed to ramp in 5 minutes with 0.5-minute switch cooldown is advantageous over a system designed to ramp in 5 minutes with 3-minute switch cooldown. Almost all conventional MRI systems have very long ramp up times measured in tens of minutes or hours, and the difference in postramp cooldown time of between tens of seconds and a few minutes is inconsequential for such systems. To enable fast-ramping systems based on dry superconducting magnets, it is advantageous to have a superconducting persistent current switch that can be cooled rapidly at the end of the magnet ramping process.

SUMMARY

Figure 1:
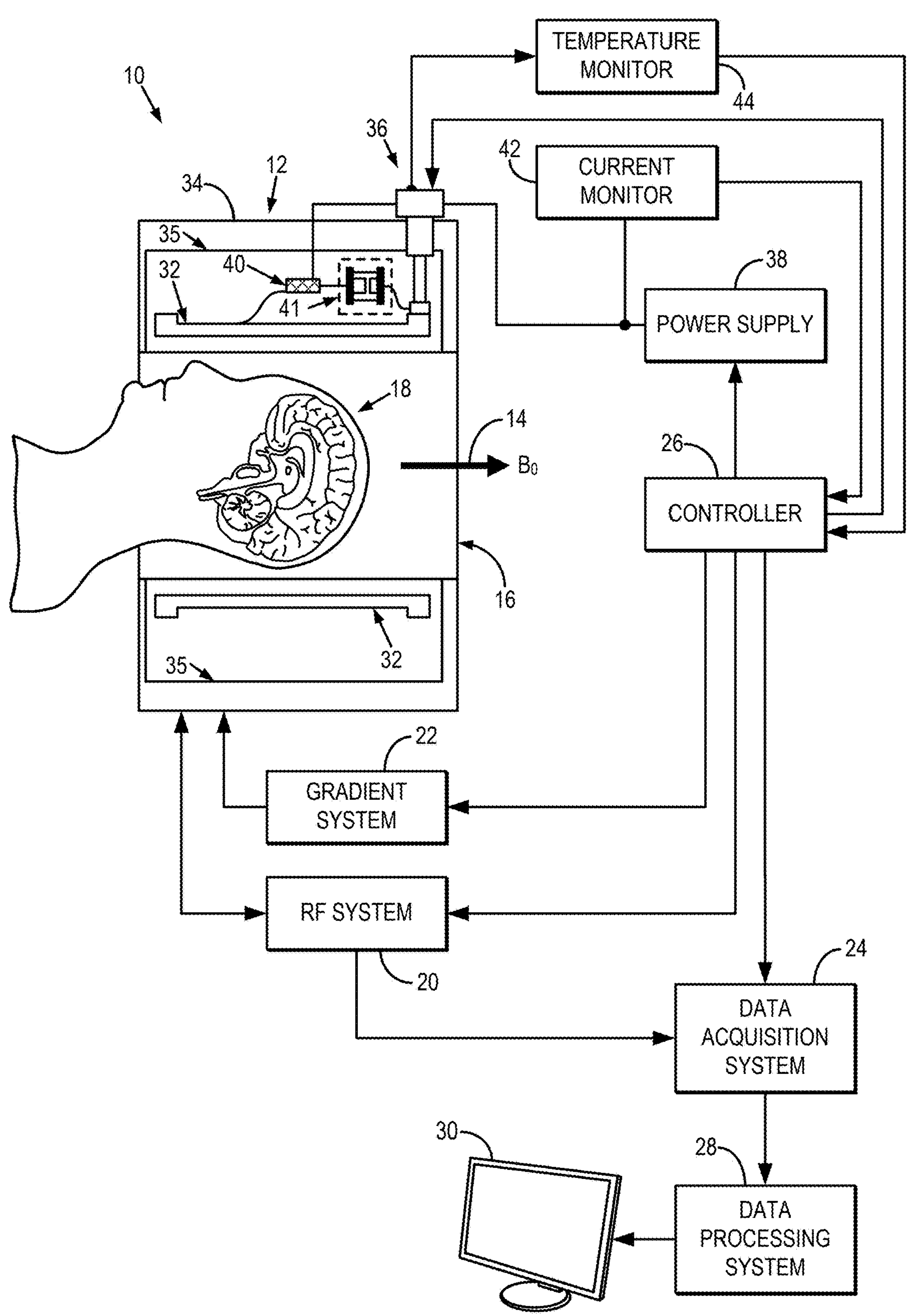
FIG. 1 is a block diagram of an example magnetic resonance imaging ("MRI") system capable of rapid magnetic field ramping. A superconducting persistent current switch is shown with a thermal connection that can be made to have variable thermal conductance.

A system and method of using a superconducting persistent current switch with variable thermal conduction for fast magnet ramping of a magnetic resonance imaging ("MRI") magnet is provided.

The method comprises controlling the thermal conduction between the cold head and the persistent current switch in a way that provides either a high or low thermal conduction state of the thermal connection between these two devices. A low thermal conduction state is in effect during magnet ramping and then, after the magnet is at a target current corresponding to a target magnetic field, the thermal link enters a high thermal conduction state to cool the persistent current switch more rapidly. This operation shortens the time at the end of ramping such that the MRI magnet can be ready for scanning in a shorter duration.

Thus, by one aspect of the present invention, a system is provided for rapid ramping of an MRI magnet, including a cooling source for the MRI magnet, a persistent current switch in a parallel circuit with the MRI magnet in combination with its ramping power supply and a variable thermal link. The variable thermal link has a first end connected to the persistent current switch and a second end connected to the cooling source. The thermal link provides a low thermal conductance connection from the cooling source to the persistent current switch while the MRI magnet is ramping and provides a high thermal conductance connection from the cooling source to the persistent current switch when the MRI magnet reaches a target current corresponding to a target magnetic field, for a rapid cooling of the persistent current switch.

By a further aspect of the present invention, a method is provided for rapid ramping of an MRI magnet, including connecting a first end of a thermal link to a persistent current switch in a parallel circuit with the MRI magnet, connecting a second end of the thermal link to a cooling source of the MRI magnet, providing a low thermal conductance connection through the thermal link from the cooling source to the persistent current switch while the MRI magnet is ramping, and providing a high thermal conductance connection through the thermal link from the cooling source to the persistent current switch when the MRI magnet has reached a target current corresponding to a target magnetic field, thereby providing a rapid cooling of the persistent current switch.

DETAILED DESCRIPTION

Described here are systems and methods for rapid magnetic field ramping in a magnetic resonance imaging ("MRI") system that includes a superconducting magnet cooled by a cryocooler.

Recently, there have been advances in superconductors and superconducting magnet design aimed at reducing the amount of liquid cryogen (liquid helium) required to achieve and maintain superconducting properties. Most superconducting magnets use so-called low temperature superconductors, typically Niobium-Titanium, which has a critical temperature of 9.2 K. Cryogen-free superconducting magnets, also known as dry magnets, using low-temperature superconductors, have been used for MRI, where the cooling is supplied by a cryocooler in direct or indirect thermal contact with the magnet coils, requiring less or no liquid cryogen for operation. Other advances include the development of high temperature superconductors that are materials that can be in a superconducting state at higher temperatures, which make the cooling requirements less extreme for a superconducting magnet. Currently, high temperature superconductors suitable for magnet winding include Niobium-Tin up to 18.3 K critical temperature or Magnesium Diboride up to 39 K critical temperature.

The systems and methods described here are based on a superconducting magnet design where the main magnetic field can be turned on and off in a short amount of time. For instance, the magnetic field can be turned on and off in an amount of time comparable to or quicker than the typical amount of time it takes to prepare a subject to be imaged in an MRI system (e.g., about 5-15 minutes).

The systems and methods described here are also based on cryogen-free superconducting magnet designs which do not have a large bath of liquid cryogen in thermal contact with the magnet internal structures. The MRI system described here is based on typical low temperature superconductors, such as Niobium-Titanium, but the systems and methods may also be extended to apply to MRI systems based on high temperature superconductors with appropriate modifications.

The MRI system described here uses a cryocooler that is in thermal contact with the magnet coils, or wire packs, in a superconducting magnet to cool them to temperatures approaching 4 K. Here, thermal contact can include direct or indirect contact, through which thermal energy can be transferred or conducted. The superconducting material used for the magnet design preferably maintains superconducting properties up to temperatures approaching 9.2 K. In the described system, current density can be added to or removed from the superconductive windings of the magnet coils in a rapid manner by introducing a power supply source into the circuit of the main magnet in parallel with a superconducting persistent current switch. Supplying this current to the magnet coils introduces heat into the system due to various effects, which can be removed using the thermal cooling capacity of the cryocooler.

In this system, the rate of current change (and thus the rate of magnetic field change) can be controlled so that the temperature of the superconducting wire does not exceed the superconducting transition temperature. In this manner, the superconducting wire maintains its superconducting properties throughout the ramping process and does not enter a normal mode, or resistive state, to cause an uncontrolled loss of magnetic field (i.e., a quench). Furthermore, the control system described here provides a simple user interaction for turning the magnetic field on and off, monitors the temperature of the magnet coils during and after magnetic field ramping, and is capable of adjusting the ramp function or ramp rate, the interval between turning the magnetic field on and off, or both, in order to maintain temperatures that are cold enough to maintain superconducting properties of the magnet coils.

Referring now to FIG. 1, a magnetic resonance imaging system 10 generally includes a magnet assembly 12 for providing a magnetic field 14 that is substantially uniform within a volume within a bore 16 that may hold a subject 18 or other object to be imaged. The magnet assembly 12 supports a radio frequency ("RF") coil (not shown) that may provide an RF excitation to nuclear spins in the object or subject (not shown) positioned within the bore 16. The RF coil communicates with an RF system 20 producing the necessary electrical waveforms, as is understood in the art.

The magnet assembly 12 also supports three axes of gradient coils (not shown) of a type known in the art, and which communicate with a corresponding gradient system 22 providing electrical power to the gradient coils to produce magnetic field gradients, Gy, Gy, and G, over time. A data acquisition system 24 connects to RF reception coils (not shown) that are supported within the magnet assembly 12 or positioned within bore 16.

The RF system 20, gradient system 22, and data acquisition system 24 each communicates with a controller 26 that generates pulse sequences that include RF pulses from the RF system 20 and gradient pulses from gradient system 22. The data acquisition system 24 receives magnetic resonance signals from the RF system 20 and provides the magnetic resonance signals to a data processing system 28, which operates to process the magnetic resonance signals and to reconstruct images therefrom. The reconstructed images can be provided to a display 30 for display to a user.

The magnet assembly 12 includes one or more magnet coils 32 housed in a vacuum housing 34, which generally provides a cryostat for the magnet coils 32, and cooled by a cryocooler 36, such as a Gifford-McMahon ("GM") cryocooler or a pulse tube cryocooler ("PT"). In general, the cryocooler 36 is in thermal contact with the magnet coils 32 and is operable to lower the temperature of the magnet coils 32 and to maintain the magnet coils 32 at a desired operating temperature. In some embodiments the cryocooler 36 includes a first stage in thermal contact with a thermal shield 35 and a second stage in thermal contact with the magnet coils 32. In these embodiments, the first stage of the cryocooler 36 maintains the thermal shield 35 at a first temperature lower than the temperature of the vacuum housing 34, and the second stage of the cryocooler 36 maintains the magnet coils 32 at a second temperature that is lower than the first temperature. In other embodiments, the cryocooler 36 may include a single stage or greater than 2 stages with one stage being the coldest stage in thermal contact with the magnet coils 32.

The magnet coils 32 are composed of wires containing superconducting material and therefore provide a superconducting magnet. The superconducting material is preferably selected to be a material with a suitable critical temperature such that the magnet coils 32 are capable of achieving desired magnetic field strengths over a range of suitable temperatures. As one example, the superconducting material can be Niobium-Titanium ("NbTi"), which has a transition temperature of about 9.2 K. As another example, the superconducting material can be Niobium-Tin ("Nb3Sn"), which has a transition temperature of about 18.3 K.

The choice of superconducting material and composition of the superconducting wire will influence the range of magnetic field strengths achievable with the magnet assembly 12. Preferably, the superconducting wire is chosen such that magnetic field strengths in the range of about 0.5 T to about 3.0 T can be achieved in bore 16 of the MRI scanner over a range of temperatures that can be suitably achieved by the cryocooler 36. In some configurations, however, the superconducting wire can be chosen to be capable of providing magnetic field strengths higher than 3.0 T.

The cryocooler 36 is operable to maintain the magnet coils 32 at an operational temperature at which the magnet coils 32 are superconducting, such as a temperature that is below the transition, or critical, temperature for the superconducting material of which the magnet coils 32 are composed. This transition temperature depends not only on the superconducting material and its form in the superconducting wire, but also on the magnetic field and electrical current in the wires of the magnet coils 32. As one example, a lower operational temperature limit can be about 4 K and an upper operational temperature limit can be at or near the transition, or critical, temperature of the superconducting material of which the magnet coils 32 are composed.

The current density in the magnet coils 32 in the MRI system 10 of the present invention is controllable to rapidly ramp up or ramp down the magnetic field 14 generated by the magnet assembly 12 while controlling the temperature of the magnet coils 32 with the cryocooler 36 to keep the temperature below the transition temperature of the superconducting material of which the magnet coils 32 are composed. As one example, the magnetic field 14 can be ramped up or ramped down on the order of minutes, such as fifteen minutes or less.

In general, the current density in the magnet coils 32 can be increased or decreased by connecting the magnet coils 32 to a circuit with a power supply 38 that is in electrical communication with the magnet coils 32 via a persistent current switch 40 and operating the power supply 38 to increase or decrease the current in the connected circuit. The persistent current switch 40 is generally a superconducting persistent current switch that is operable between a first, closed, state and a second, open, state.

When the persistent current switch 40 is in its closed state, the magnet coils 32 are in a closed circuit, which is sometimes referred to as "persistent mode." In this configuration, the magnet coils 32 and the persistent current switch 40 are both in a superconducting state so long as the temperatures of the magnet coils 32 and the persistent current switch 40 are maintained at a temperature at or below the transition temperature of the superconducting material of which they are composed. With the persistent current switch 40 in this state, there is essentially zero electrical resistance across the persistent current switch and because the self-inductance of the persistent current switch 40 is extremely small compared to the self-inductance of the magnet coils 32, the power supply 38 is incapable of changing the current circulating in the magnet coils 32.

When the persistent current switch 40 is heated to a temperature above its superconducting transition temperature, the persistent current switch 40 is in its open state where there is a relatively high electrical resistance across the persistent current switch 40, for example 100 Ohms. In this state, the power supply 38 is capable of changing the current circulating in the magnet coils 32 and only a trickle of current may pass through the persistent current switch 40 as a result of the voltage across the terminals of the power supply 38. For instance, if the power supply 38 is operated to supply more current to the connected circuit, the current in the magnet coils 32 will increase, which will increase the strength of the magnetic field 14. On the other hand, if the power supply 38 is operated to decrease the current in the connected circuit, the current in the magnet coils 32 will decrease, which will decrease the strength of the magnetic field 14. In this manner, the magnetic field 14 of the magnet can be ramped up or ramped down.

When the current circulating the magnet coils 32 has reached the desired target value, the persistent current switch 40 is allowed to cool below its superconducting transition temperature and thus eventually change to its closed state. After the persistent current switch 40 is in its closed state, the power supply 38 may be disconnected or disabled and the magnet will maintain its magnetic field 14 indefinitely because the persistent current switch 40 and magnet coils 32 form a series circuit.

It will be appreciated by those skilled in the art that any suitable superconducting persistent current switch can be used for selectively connecting the magnet coils 32 and power supply 38 into a connected circuit; however, as one non-limiting example, the persistent current switch 40 may include a length of superconducting wire wound onto a spool in a bifilar arrangement that is connected in parallel to the magnet coils 32 and the power supply 38. To operate such a persistent current switch 40 into its open state, a heater (not shown) in thermal contact with the persistent current switch 40 is operated to raise the temperature of the superconducting wire above its transition temperature, which in turn makes the wire highly resistive compared to the inductive impedance of the magnet coils 32. As a result, very little current will flow through the persistent current switch 40 compared with the magnet coils 32 with the power supply 38 operating in the connected circuit.

When the magnet coils 32 are in the connected circuit with the power supply 38, the temperature of the magnet coils 32 will increase as the current in the magnet coils 32 changes. Thus, the temperature of the magnet coils 32 should be monitored to ensure that the temperature of the magnet coils 32 remains below the transition temperature for the superconducting material of which they are composed. Because placing the magnet coils 32 into a connected circuit with the power supply 38 will tend to increase the temperature of the magnet coils 32, the rate at which the magnetic field 14 can be ramped up or ramped down will depend in part on the cooling capacity of the cryocooler 36. For instance, a cryocooler with a larger cooling capacity will be able to remove heat at a higher rate from the magnet coils 32 while they are in a connected circuit with the power supply 38 and the current is changing.

The power supply 38 and the persistent current switch 40 operate under control from the controller 26 to provide current to the magnet coils 32 when the power supply 38 is in a connected circuit with the magnet coils 32. A current monitor 42 measures the current flowing to the magnet coils 32 from the power supply 38, and a measure of the current can be provided to the controller 26 to control the ramping up or ramping down of the magnetic field 14. In some configurations, the current monitor 42 is integrated into the power supply 38.

A temperature monitor 44 is connected to one or more temperature sensors (not shown) which are in thermal contact with components inside the magnet assembly 12, such as the magnet coils 32 and persistent current switch 40, and monitors these temperatures in real time. As one example, the temperature monitor 44 can be connected to a thermocouple temperature sensor, a diode temperature sensor (e.g., a silicon diode or a GaAlAs diode), a resistance temperature detector ("RTD"), a carbon ceramic temperature sensor, a capacitive temperature sensor, and so on. RTD-based temperature sensors can be composed of ceramic oxynitride, germanium, ruthenium oxide, or other suitable materials. The temperature of the magnet coils 32 and the persistent current switch 40 is monitored and the temperature data can be provided to the controller 26 to control the ramping up or ramping down of the magnetic field 14.

In operation, the controller 26 is programmed to ramp up or ramp down the magnetic field 14 of the magnet assembly 12 in response to instructions from a user. As mentioned above, the magnetic field 14 can be ramped down by decreasing the current density in the magnet coils 32 by reducing current to the magnet coils 32 from the power supply 38 via the persistent current switch 40, which is controlled by the controller 26. Likewise, the magnetic field 14 can be ramped up by increasing the current density in the magnet coils 32 by increasing current to the magnet coils 32 from the power supply 38 via the persistent current switch 40, which is controlled by the controller 26.

The controller 26 is also programmed to monitor various operational parameter values associated with the MRI system 10 before, during, and after ramping the magnetic field 14 up or down. As one example, as mentioned above, the controller 26 can monitor the current supplied to the magnet coils 32 by the power supply 38 via data received from the current monitor 42. As another example, as mentioned above, the controller 26 can monitor the temperature of the magnet coils 32 via data received from the temperature monitor 44. As still another example, the controller 26 can monitor the strength of the magnetic field 14, such as by receiving data from a magnetic field sensor, such as a Hall probe or NMR probe or the like, positioned in or proximate to the bore 16 of the magnet assembly 12.

A variable thermal link 41 is connected thermally on one end to the coldest stage of the cryocooler 36 and on the other end to the persistent current switch 40. The variable thermal link 41 may operate passively or actively through the aid of some form of external control. The thermal connection between the persistent current switch 40 and the coldest stage of the cryocooler 36 may be entirely through the variable thermal link 41 or the thermal connection may include one or more additional heat conduction elements that provide a permanent thermal connection between the persistent current switch 40 and the coldest stage of the cryocooler 36.

DESCRIPTION OF INVENTION

The disclosure is a system and method of controlling the thermal conductance between the cold head and the persistent current switch in a dry superconducting magnet in a way that provides a high or low thermal conductance state of the thermal connection, or link, between these two devices. The thermal connection is designed to have a low thermal conductance during magnet ramping and a high thermal conductance following the completion of magnet ramping to a target current value corresponding to a target magnetic field in such a manner that the total duration of the ramping process is reduced.

Figure 2:
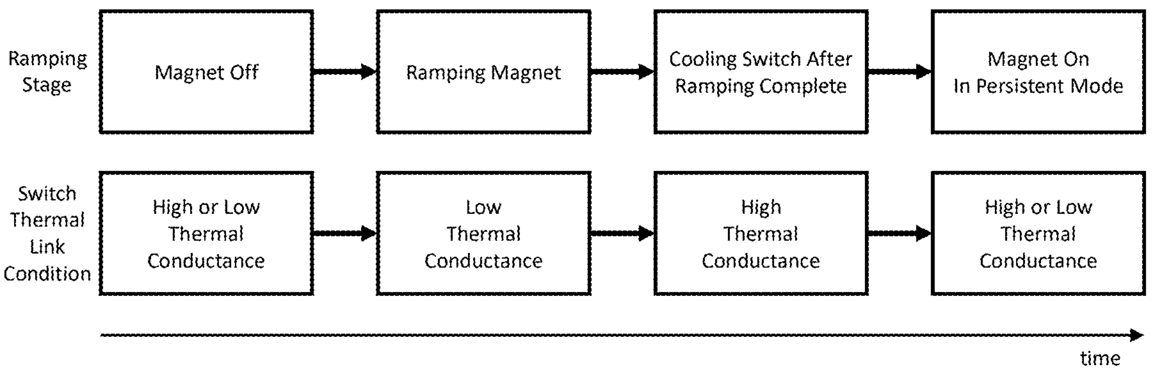
FIG. 2 is a block diagram illustrating a comparison of ramping stages and the state of the thermal conductance of a variable thermal link to the superconducting persistent current switch during each ramping stage.

FIG. 2 is a block diagram illustrating a comparison of ramping stages and the state of the thermal conductance of a variable thermal link to the persistent current switch during each ramping stage. According to FIG. 2, when the magnet is off the thermal link may be in a high or low thermal conductance state, and then in the next stage during magnet ramping the thermal link is in a low thermal conductance state, and then in the next stage when ramping is complete but before the persistent current switch has cooled sufficiently to be superconducting the thermal link is in a high thermal conductance state to hasten the cooling rate of the persistent current switch.

Implementation of the variable thermal conductance link can consist of a number of different forms, including both passive and active approaches or a combination of multiple methods to achieve a high or low thermal conductance state at the desired stages of ramping the magnet. The thermal link between cold head and persistent current switch may include a combination of a fixed thermal connection and a variable thermal link such that the thermal link has some non-zero thermal conductance while the thermal conductance of the variable thermal link is at or near zero. As one non-limiting example, the difference in thermal conductance between the high and low thermal conductance states may represent a difference of a factor of 2 or greater.

Figure 3:
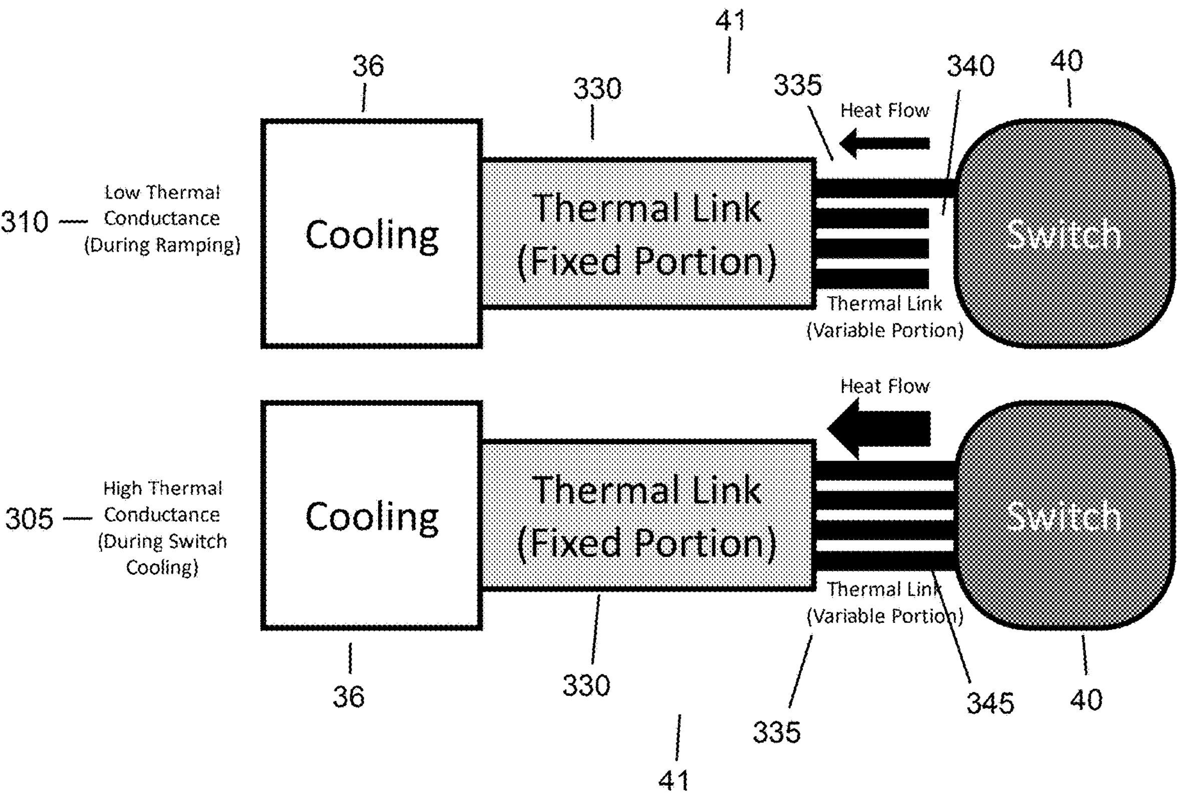
FIG. 3 is a diagram illustrating states of high and low thermal conductance for a variable thermal link between the cooling source and the superconducting persistent current switch.

FIG. 3 is a diagram illustrating the states of high 305 and low 310 thermal conductance for a variable thermal link 41 between the cooling source 36 and the persistent current switch 40. According to FIG. 3, the variable thermal link 41 may include a fixed portion 330 of a thermal conductor and a variable portion 335 of a thermal conductor. An embodiment is shown in FIG. 3 whereby at times some portions of the thermal link 41 are disconnected 340 between the persistent current switch 40 and the cooling source 36 resulting in a low thermal conductance 310 during ramping. According to this embodiment shown in FIG. 3, at other times some portions of the thermal link 41 are made to connect 345 between the persistent current switch 40 and the cooling source 36 resulting in a high thermal conductance 305 during ramping, which shortens the duration of the cooldown of the persistent current switch 40 following ramping.

Figure 4:
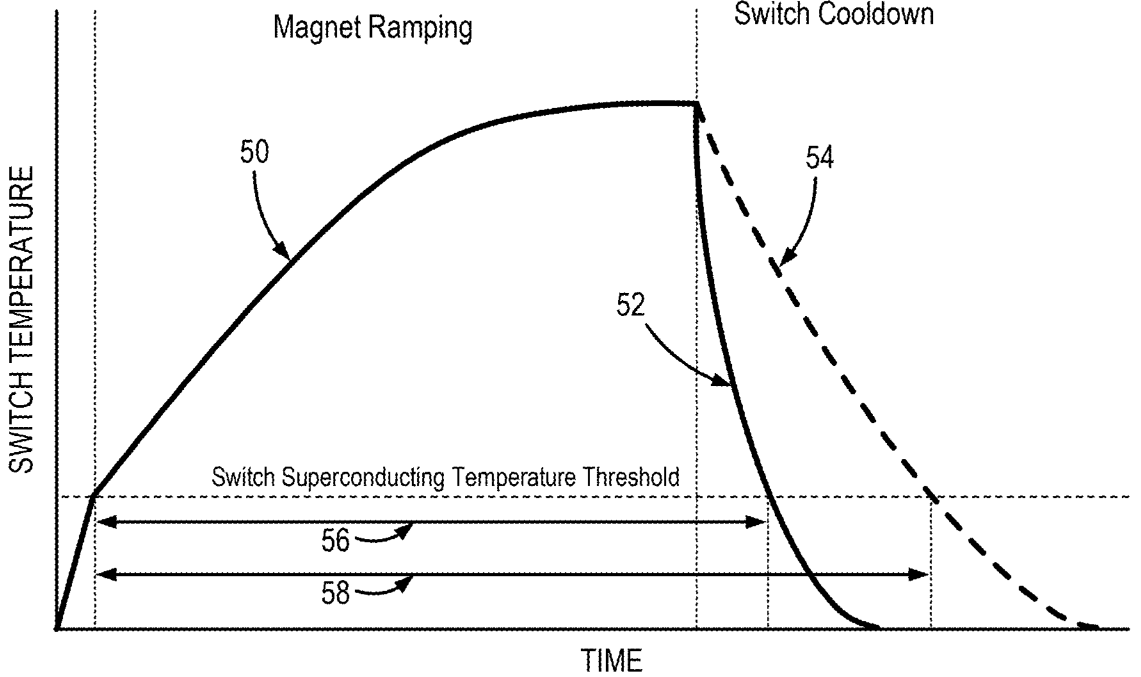
FIG. 4 is a plot illustrating an example of superconducting persistent current switch temperature as a function of time during a magnet ramping process followed by switch cooldown with and without a variable thermal link to the persistent current switch.

FIG. 4 is a plot illustrating the persistent current switch temperature as a function of time. The persistent current switch temperature during magnet ramping 50 is above the switch superconducting temperature threshold. After the magnet ramping has ended, the switch is allowed to cool to below the persistent current switch superconducting temperature threshold after which the magnet may be made to enter persistent mode. An MRI magnet containing a variable thermal link between the cryocooler and the switch may exhibit a more rapid cooldown rate compared with an MRI magnet that contains a fixed thermal link to the switch. The cooldown curve of the switch with a fixed thermal link is shown by label 54 corresponding to total ramp up duration 58. The cooldown curve of the persistent current switch with a variable thermal link in a high thermal conductance state is shown by label 52 corresponding to a shorter total ramp up duration 56.

Figure 5:
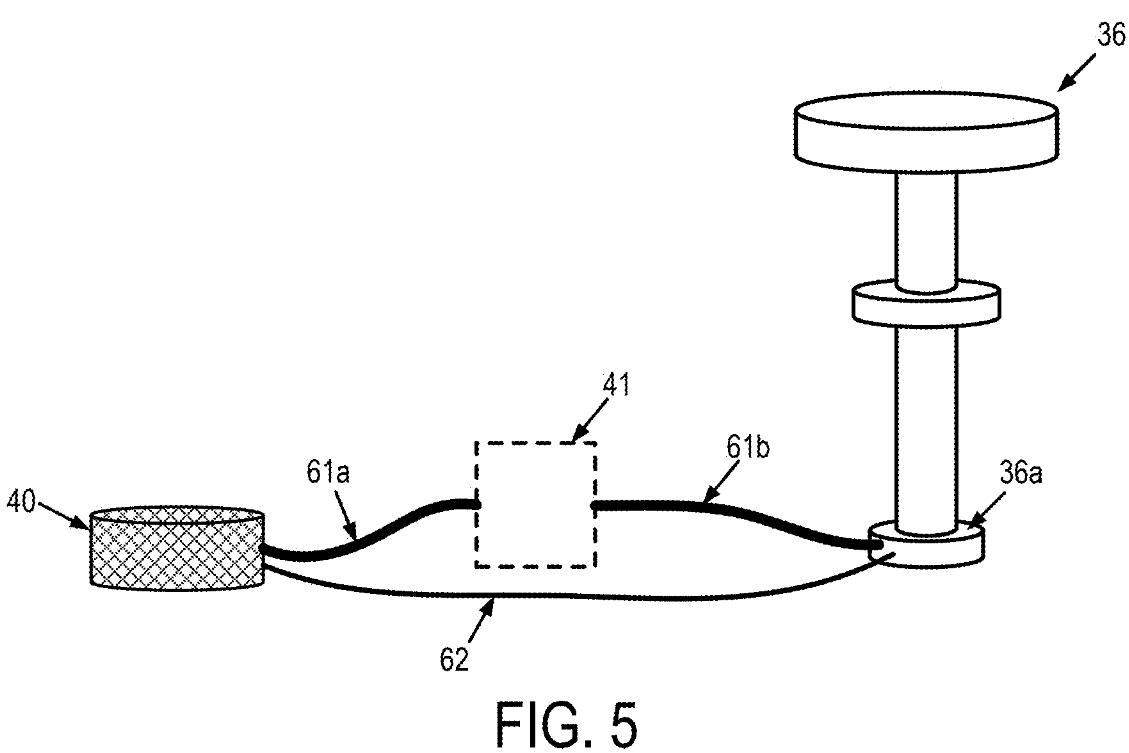
FIG. 5 is a block diagram of an arrangement of a variable thermal link connected thermally in between the cryocooler and the superconducting persistent current switch with a fixed thermal link permanently connected directly between the cryocooler and the superconducting persistent current switch.

FIG. 5 is a diagram illustrating one embodiment of the use of a variable thermal link 41 to connect the coldest stage 36*a* of a cryocooler 36 to a persistent current switch 40. The variable thermal link 41 is connected to the coldest stage 36*a* by thermal connector 61*b* and to the persistent current switch 40 by thermal connector 61*a*. A fixed thermal link 62 permanently connects the coldest stage 36*a* to the persistent current switch 40 and provides a baseline low thermal conductance cooling connection to the switch. When variable thermal link 41 is in a high thermal conductance state, the total effective thermal conductance between the cryocooler 36 and the persistent current switch 40 is high. In contrast, when variable thermal link 41 is in a low thermal conductance state, the total effective thermal conductance between cryocooler 36 and the persistent current switch 40 is low.

Figures 6A, 6B, 6C, 6D:
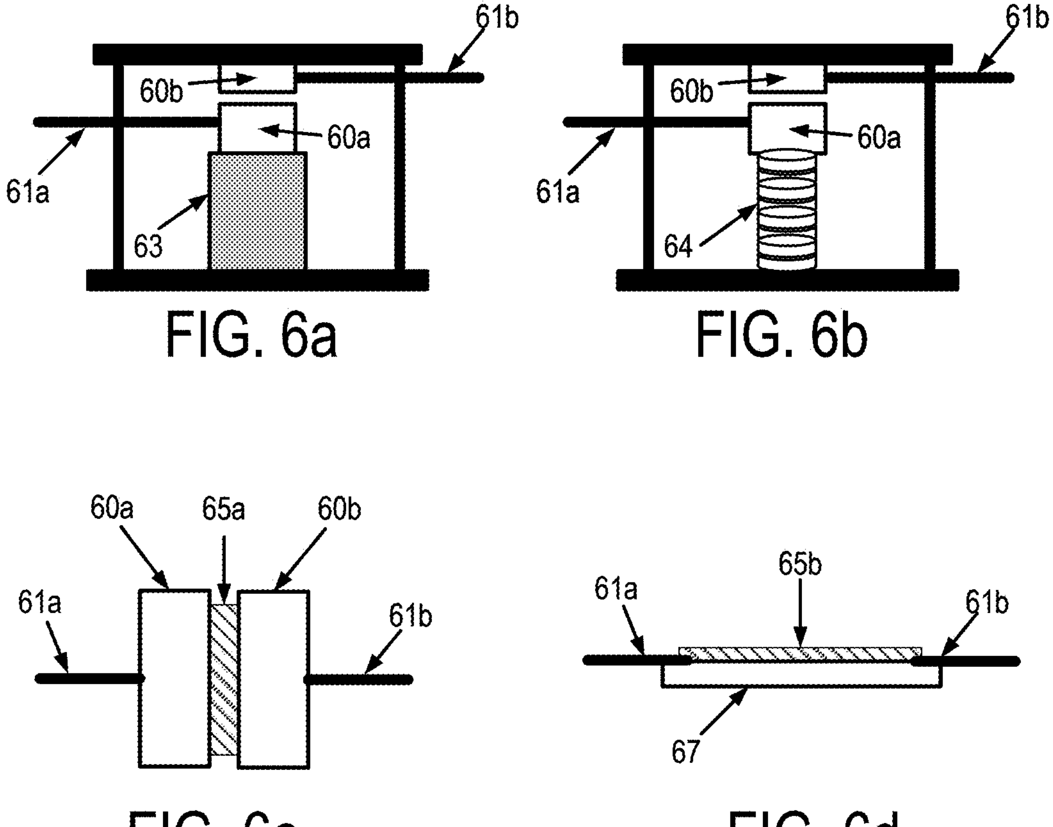
FIGS. 6*a-d* show a variety of concepts for implementing a variable thermal link.

In one embodiment, the thermal link between cold head and persistent current switch may include a thermal actuator operating on the principle of differential thermal contraction between two or more different materials or a shape memory effect. In such an embodiment, the thermal actuator may either facilitate thermal conduction through itself or the thermal actuator may be connected mechanically to a split thermal conductor. In either case, below some threshold temperature, the thermal actuator causes at least two thermal conducting surfaces to be pressed together with high force leading to a high thermal conductance state. Above the threshold temperature, the thermal conducting surfaces may separate or be in contact with lower force leading to a low conductance state. In this embodiment, the temperature of the thermal actuator may be raised by means of a heater circuit powered either through an independent power supply or by the voltage difference created by the main magnet power supply during ramping, or by passive means due to the increased heat dissipation of the switch during ramping. In such embodiments the inclusion of an interposer material between the thermal conducting surfaces, such as grease or a malleable thermally conductive metal such as gold plating, may help reduce the potential for diffusion bonding between the thermal conducting surfaces. In embodiments where a split thermal conductor is employed, there may be a thermal insulator interposer material placed in between the thermal actuator and the split thermal conductor to reduce heat transmission between the actuator and the high thermal conductance elements. Referring to FIG. 6*a*, the thermal actuator 63 is connected to a split thermal conductors 60*a* and 60*b* with connections 61*a* and 61*b* connecting the ends of the split thermal conductors 60*a* and 60*b* to the persistent current switch and the cryocooler, respectively.

In another similar embodiment to the above, the thermal link between cold head and persistent current switch may include a mechanically controlled connection to press together or separate the thermal connection of at least two thermal conducting faces. Below some threshold temperature, the mechanically controlled connection mechanism presses at least two thermal conducting surfaces together with high force leading to a high thermal conductance state. Above the threshold temperature, the mechanism may separate or reduce the contact force between the thermal conducting surfaces leading to a low conductance state. In such an embodiment, the mechanism may be controlled by some mechanical means external to the magnet, such as a motor or actuator, through a vacuum interface such as a bellows. The mechanism may alternatively be controlled by pressurizing a gas or hydraulic fluid. The mechanism may alternatively be controlled by an actuator internal to the vacuum vessel of the magnet, for example by a piezoelectric device. Electrical power to control the mechanism may be supplied from an external power supply activated by the MRI system controller, or from the magnet ramping voltage. Referring to FIG. 6*b*, the mechanically controlled connection 64 can be actuated to press together or separate thermal conducting surfaces 60*a* and 60*b* which are connected to the switch and cryocooler by connections 61*a* and 61*b*, respectively.

In such embodiments that involve the passive or active control of mechanical contact and separation between two or more thermal conducting surfaces, the inclusion of an interposer material between the thermal conducting surfaces, such as grease or a malleable thermally conductive metal such as gold plating, may help reduce the potential for bonding between the thermal conducting surfaces while simultaneously improving the effective surface area of contact by filling gaps in contact arising from the surface roughness of the contacting faces.

In another embodiment, the thermal link between cold head and persistent current switch may include at least one material component that has lower thermal conductivity while it is at an elevated temperature. In this embodiment, the temperature of the thermal link may be raised by means of a heater circuit powered either through an independent power supply or by the voltage difference created by the main magnet power supply during ramping, or by passive means due to the increased heat dissipation of the persistent current switch during ramping. After the magnetic field of the magnet is ramped fully, the heating of the thermal link may be stopped such that the thermal link is allowed to cool. If made of an appropriate material, it may enter a high thermal conductivity state at colder temperatures, thereby allowing the persistent current switch to be cooled rapidly to below its superconducting threshold temperature. As one non-limiting example of this embodiment, very high purity copper may be used as a material component in a variable thermal link of a dry magnet based on a Magnesium-Diboride superconducting wire with an operating temperature near, for example, 20 K, such that when the thermal link is heated above, for example, 30 K, the thermal conductance of the high purity copper component is significantly lower than the thermal conductance of the same component at a lower temperature following the ramping process.

In another similar embodiment to the above, the thermal link between cold head and persistent current switch may include at least one superconducting thermal interface that is designed to have a high thermal conductance below a threshold temperature and a low thermal conductance above the threshold temperature. By means of example and without loss of generality, the interface may be formed from a thin layer of material disposed between at least two thermal conducting surfaces, or it may be a strand, tape or wire connecting at least two thermal conducting surfaces which may be supported by a low thermal conductance backing for mechanical support. In this embodiment, it is necessary to take into account the effect of the magnetic field in the vicinity of the coils at the location of the thermal interface as a factor that will affect the threshold temperature below which the interface is in a superconducting state. When the interface is below the threshold temperature and in a superconducting state, the thermal conductance will be high. In contrast when the interface is above the threshold temperature and in a non-superconducting state, the thermal conductance will be comparatively low.

Referring to FIG. 6*c*, a thin layer of superconducting thermal interface 65*a* is disposed between two thermal conductors 60*a* and 60*b*. Referring to FIG. 6*d*, a strand, tape, or wire of superconducting thermal interface 65*b* is placed on a thermally insulating backing material 67.

In another similar embodiment to the above, the thermal link between cold head and persistent current switch may include at least one material component that changes its thermal conductivity when an electrical current or voltage is applied to it. In this embodiment, the temperature of the thermal link may be raised by means of a circuit powered either through an independent power supply or by the voltage difference created by the main magnet power supply during ramping. If made of an appropriate material, it may enter a high thermal conductivity state at colder temperatures, thereby allowing the persistent current switch to be cooled rapidly to below its superconducting threshold temperature.

In summary, the present invention is to combine a thermal switch or variable thermal link designed for operation at cryogenic temperatures with a persistent current switch in a dry superconducting magnet. The variable thermal link can be made to enter a high thermal conductance state during switch cooldown after ramping the magnetic field of the magnet, thereby shortening the duration of persistent current switch cooldown and shortening the time to complete the entire process of ramping the magnetic field and setting the magnet into persistent current mode. This is a special problem for dry superconducting systems which are conduction cooled in contrast to wet helium-filled magnets where the persistent current switch can be rapidly cooled by direct contact with liquid helium. This invention enables dry superconducting magnets to be ramped more quickly, and MRI systems including a variable thermal link to the persistent current switch may be capable of being ready for imaging a subject sooner than MRI systems that do not include a variable thermal link to the persistent current switch. Shortening the time of ramping is important in a variety of applications of MRI, for example in an interventional MRI application where the field of the magnet is off during surgery and then must be turned on to image a patient in a short amount of time to avoid delay during surgery.

It is standard art for designers of dry conduction-cooled MRI magnets to include a fixed and permanent thermal connection between the persistent current switch and the coldest stage of the cryocooler, such as with a braid or strip made of copper or aluminum permanently connecting the persistent current switch to the cryocooler. Of course, the thermal conductivity of materials, including metals, varies with temperature and because the persistent current switch temperature is elevated during magnet ramping, the thermal connection will necessarily also be at an elevated temperature at the end of magnet ramping and then cool as the persistent current switch itself cools. While the thermal conductance would change passively during the persistent current switch cooldown stage in this case, what distinguishes this invention from standard art is that the thermal conductance of the variable thermal link to the persistent current switch is designed to be capable of entering a significantly higher thermal conductance state during persistent current switch cooldown compared to the thermal conductance during magnet ramping.

General Considerations

While some embodiments or aspects of the present disclosure may be implemented in fully functioning computers and computer systems, other embodiments or aspects may be capable of being distributed as a computing product in a variety of forms and may be capable of being applied regardless of the machine or computer readable media used to affect the distribution.

At least some aspects disclosed may be embodied, at least in part, in software. That is, some disclosed techniques and methods may be carried out in a computer system or other data processing system in response to its processor, such as a microprocessor, executing sequences of instructions contained in a memory, such as read-only memory (ROM), volatile random access memory (RAM), non-volatile memory, cache or a remote storage device.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. It should be noted that a computer-readable medium may be tangible and non-transitory. As used herein, the term "code" may refer to software, instructions, code or data that is/are executable by a computing device or processor. A "module" can be considered as a processor executing computer-readable code.

A processor as described herein can be a general-purpose processor, a digital signal processor (DSP), an application specific integrated circuit (ASIC), a field programmable gate array (FPGA) or other programmable logic device, discrete gate or transistor logic, discrete hardware components, or any combination thereof configured to perform the functions described herein. A general-purpose processor can be a microprocessor, but in the alternative, the processor can be a controller, or microcontroller, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. In some embodiments, a processor can be a graphics processing unit (GPU). The parallel processing capabilities of GPUs can reduce the amount of time for training and using neural networks (and other machine learning models) compared to central processing units (CPUs). In some embodiments, a processor can be an ASIC including dedicated machine learning circuitry custom-build for one or both of model training and model inference. The disclosed or illustrated tasks can be distributed across multiple processors or computing devices of a computer system, including computing devices that are geographically distributed.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

The specific embodiments described above have been shown by way of example and understood is that these embodiments may be susceptible to various modifications and alternative forms. Further understood is that the claims are not intended to be limited to the forms disclosed, but rather to cover all modifications, equivalents, and alternatives falling within the spirit and scope of this disclosure. While the foregoing written description of the system enables one of ordinary skill to make and use what is considered presently to be the best mode thereof, those of ordinary skill will understand and appreciate the existence of variations, combinations, and equivalents of the specific embodiment, method, and examples herein. The system should therefore not be limited by the above-described embodiment, method, and examples, but by all embodiments and methods within the scope and spirit of the system. Thus, the present disclosure is not intended to be limited to the implementations shown herein but is to be accorded the widest scope consistent with the principles and novel features disclosed herein.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become obvious to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, various changes and modifications in form, material, workpiece, and fabrication material detail may be made, without departing from the spirit and scope of the present disclosure, as set forth in the appended claims, as may be apparent to those of ordinary skill in the art, are also encompassed by the present disclosure.

What is claimed is:

1. A system for rapid ramping of an MRI magnet, the system comprising:

a cooling source for the MRI magnet;

a persistent current switch in a circuit with coils of the MRI magnet; and a thermal link having a first end thermally coupled to the persistent current switch and a second end thermally coupled to the cooling source;

wherein the thermal link is configured to provide a low thermal conductance connection between the cooling source and the persistent current switch while the MRI magnet is ramping; and wherein the thermal link is configured to provide a high thermal conductance connection between the cooling source and the persistent current switch when the MRI magnet reaches a target current corresponding to a target magnetic field to rapidly cool the persistent current switch;

wherein the thermal link comprises a variable thermal conductance interface including at least two thermally conductive members having mating surfaces; and wherein the thermal link further comprises an actuator configured to change a contact force between the mating surfaces, and to selectively configure the variable thermal conductance interface between:

(i) a first state in which the mating surfaces are pressed together under a first contact force to provide the high thermal conductance connection; and (ii) a second state in which the mating surfaces are separated or in contact under a second, lower contact force to provide the low thermal conductance connection.

2. The system of claim 1, wherein the thermal link comprises:

a fixed thermal connection having a non-zero thermal conductance; and a variable thermal connection comprising the variable thermal conductance interface.

3. The system of claim 1, wherein the actuator comprises a thermal actuator having a temperature-dependent dimensional change, the thermal actuator being configured such that:

as a temperature of the thermal actuator decreases below a threshold temperature, the thermal actuator changes dimension to increase the contact force between the mating surfaces and thereby provide the high thermal conductance connection; and as the temperature of the thermal actuator increases above the threshold temperature, the thermal actuator changes dimension to decrease the contact force between the mating surfaces and thereby provide the low thermal conductance connection.

4. The system of claim 3, wherein the thermal actuator is mechanically connected to a split thermal conductor, and wherein the split thermal conductor comprises the thermally conductive members having the mating surfaces of the variable thermal conductance interface.

5. The system of claim 4, wherein a thermal insulator is disposed between the thermal actuator and the split thermal conductor.

6. The system of claim 3, wherein the temperature of the thermal actuator is regulated by at least one of:

a heater circuit powered by an independent power supply;

a heater circuit powered by a voltage difference created by an MRI magnet power supply during magnet ramping; and an increased heat dissipation of the persistent current switch during magnet ramping.

7. The system of claim 1, wherein the variable thermal conductance interface further comprises an interposer material between the mating surfaces, whereby the interposer material increases the thermal conductance between the mating surfaces when the variable thermal conductance interface is in the first state in which the mating surfaces are pressed together.

8. The system of claim 1, wherein the actuator comprises a mechanically controlled actuator configured to mechanically move at least one of the thermally conductive members so as to change the contact force between the mating surfaces and thereby selectively place the variable thermal conductance interface in the first state or the second state.

9. The system of claim 8, wherein the mechanically controlled actuator comprises at least one of:

a motor or actuator configured to transmit mechanical force through a vacuum interface such as a bellows;

an actuator driven by pressurizing a gas or hydraulic fluid;

an actuator internal to a vacuum vessel of the magnet, such as a piezoelectric device;

wherein electrical power to the mechanically controlled actuator is supplied from at least one of:

an external power supply activated by an MRI system controller; and a magnet ramping voltage.

10. A system for rapid ramping of an MRI magnet, the system comprising:

a cooling source for the MRI magnet;

a persistent current switch in a circuit with coils of the MRI magnet; and a thermal link having a first end thermally coupled to the persistent current switch and a second end thermally coupled to the cooling source;

wherein the thermal link is configured to provide a low thermal conductance connection between the cooling source and the persistent current switch while the MRI magnet is ramping; and wherein the thermal link is configured to provide a high thermal conductance connection between the cooling source and the persistent current switch when the MRI magnet reaches a target current corresponding to a target magnetic field to rapidly cool the persistent current switch;

wherein the thermal link comprises at least one variable thermal conductivity material component configured to change thermal conductivity thereof between:

(i) a low thermal conductivity state providing the low thermal conductance connection during magnet ramping; and (ii) a high thermal conductivity state providing the high thermal conductance connection after magnet ramping.

11. The system of claim 10, wherein the variable thermal conductivity material component changes thermal conductivity in response to a change in temperature thereof.

12. The system of claim 11, wherein the variable thermal conductivity material component comprises high purity copper.

13. The system of claim 11, further comprising a heater configured to change state of the variable thermal conductivity material component, powered by at least one of: an independent power supply; a voltage difference created by an MRI magnet power supply during magnet ramping; and heat dissipation from the persistent current switch during magnet ramping.

14. The system of claim 10, wherein the variable thermal conductivity material component changes thermal conductivity in response to application of electrical current or voltage thereto.

15. The system of claim 10, wherein the variable thermal conductivity material component changes thermal conductivity in response to application of magnetic field thereto.

16. The system of claim 10, wherein the variable thermal conductivity material component comprises a superconducting material wherein thermal conductance thereof changes between a superconducting state and a non-superconducting state.

17. The system of claim 16, wherein the superconducting material comprises at least one of: a thin layer disposed between thermal conducting surfaces; and a strand, tape, or wire on a low thermal conductance backing.

18. The system of claim 16, wherein the superconducting material is positioned proximate a coil of the magnet such that a magnetic field therefrom affects the superconducting state thereof.

19. A method for rapid ramping of an MRI magnet, the method comprising:

providing a cooling source for the MRI magnet and a persistent current switch in a circuit with coils of the MRI magnet;

while the MRI magnet is ramping, configuring a thermal link to provide a low thermal conductance connection between the cooling source and the persistent current switch; when the MRI magnet reaches a target current corresponding to a target magnetic field, configuring the thermal link to provide a high thermal conductance connection between the cooling source and the persistent current switch to rapidly cool the persistent current switch; wherein configuring the thermal link between the low thermal conductance connection and the high thermal conductance connection comprises at least one of:

(a) changing a contact force between mating surfaces of a variable thermal conductance interface using an actuator to selectively configure the interface between a first pressed state providing the high thermal conductance connection and a second low-force state providing the low thermal conductance connection; and (b) changing thermal conductivity of at least one material component of the thermal link between a low thermal conductivity state providing the low thermal conductance connection and a high thermal conductivity state providing the high thermal conductance connection.

* * * * *